United States Patent
Wu et al.

(10) Patent No.: US 7,053,725 B1
(45) Date of Patent: May 30, 2006

(54) 4X CRYSTAL FREQUENCY MULTIPLIER WITH OP AMP BUFFER BETWEEN 2X MULTIPLIER STAGES

(75) Inventors: Ke Wu, San Jose, CA (US); Tony Yeung, Milpitas, CA (US); Michael Y. Zhang, Palo Alto, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 18 days.

(21) Appl. No.: 10/904,128

(22) Filed: Oct. 25, 2004

(51) Int. Cl.
 *H03B 5/32* (2006.01)
(52) U.S. Cl. .................................. 331/156; 311/116 R
(58) Field of Classification Search ................ 331/156, 331/116 R, 43
 See application file for complete search history.

(56) References Cited

U.S. PATENT DOCUMENTS

| | | | |
|---|---|---|---|
| 4,388,626 A | 6/1983 | Gans | 342/373 |
| 4,612,667 A * | 9/1986 | Hansen | 455/98 |
| 4,661,785 A | 4/1987 | Benjaminson | 331/109 |
| 5,126,694 A | 6/1992 | Montress et al. | 331/18 |
| 5,263,197 A | 11/1993 | Manjo et al. | 455/324 |
| 6,057,740 A | 5/2000 | Consolazio et al. | 331/25 |
| 6,169,459 B1 | 1/2001 | Wessendorf | 331/110 |
| 6,326,854 B1 | 12/2001 | Nicholls et al. | 331/56 |
| 6,667,666 B1 | 12/2003 | Uzunoglu | 331/173 |
| 6,677,862 B1 | 1/2004 | Houlihane et al. | 340/870.03 |
| 6,714,086 B1 | 3/2004 | Landrith et al. | 331/56 |
| 2003/0134610 A1 | 7/2003 | DiCamillo et al. | 455/259 |
| 2005/0030108 A1 * | 2/2005 | Duncan et al. | 331/16 |

* cited by examiner

*Primary Examiner*—Joseph Chang
(74) *Attorney, Agent, or Firm*—Stuart T. Auvinen

(57) ABSTRACT

A frequency-multiplying circuit generates a multiple of the fundamental frequency of a crystal that oscillates. A first differential multiplier is coupled to the crystal nodes and generates a frequency-doubled output. The frequency-doubled output is applied to an op amp that buffers the output and compares it to a reference to generate a pair of differential buffered signals. The differential buffered signals are applied to a second differential multiplier that generates a final quadrupled-frequency output. The differential multipliers can each have a pair of differential transistors that receive signals that oscillate out-of-phase to each other by 180 degrees. The drains of the differential transistors connect together at a summing node to sum the transistor currents, producing the frequency-doubled output. A crystal driver circuit using cross-coupled and direct-coupled transistors may also be attached to the crystal nodes.

20 Claims, 6 Drawing Sheets

US 7,053,725 B1

4X CRYSTAL FREQUENCY MULTIPLIER WITH OP AMP BUFFER BETWEEN 2X MULTIPLIER STAGES

FIELD OF THE INVENTION

This invention relates to crystal oscillator circuits, and more particularly to frequency multiplier circuits for use with crystal oscillators.

BACKGROUND OF THE INVENTION

Digital electronic systems rely on precise clocks for sequencing among operating states. Higher-speed systems often require faster and faster clock rates.

Crystal oscillators are often used to generate these clocks. A piezoelectric effect causes a crystal such as quartz to vibrate and resonate at a particular frequency. The quartz crystal naturally oscillates at a particular frequency, its fundamental frequency that can be hundreds of megahertz.

The frequency of oscillation can be adjusted somewhat by adjusting the voltage bias to a varactor on the crystal's terminals. However, frequency adjustment is much less than 1 percent. Such voltage-controlled crystal oscillators (VCXO) are popular for their ease of output-frequency adjustment.

While such crystal oscillators or resonators are useful, manufacturing methods may place an upper limit on the available frequency from a crystal. Very high-speed systems may require clocks that are faster than the fundamental clock rates of commonly-available crystal oscillators. Sometimes the clock output can be multiplied, such as by using a phase-locked loop (PLL) or a clock-doubler circuit. However, even doubling the frequency may not be sufficient for higher-speed systems.

PLL frequency multipliers also can generate 2×, 4× or 8× clock frequencies, but the PLL injects much noise into the oscillating signal due to its voltage-controlled oscillator (VCO). The VCO is a low Q block, so its noise spectrum is very much wider than a crystal, which has a large Q or a much narrower noise spectrum. Hence, non PLL frequency multipliers usually have much better noise and jitter performance than PLL frequency multipliers.

The fundamental frequency of oscillation of the crystal may be limited by various factors, such as the geometry of the crystal. Higher frequencies may require thinner crystals that are much more expensive to manufacture. Thus crystals are currently limited to frequencies of less than 200 MHz for inexpensive crystals, or 500 MHz for expensive crystals.

What is desired is a crystal oscillator circuit that outputs a faster clock than the fundamental frequency of the crystal. A crystal oscillator circuit that multiples the fundamental crystal frequency by four or more is desirable.

DETAILED DESCRIPTION

The present invention relates to an improvement in crystal-oscillator frequency-multiplier circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
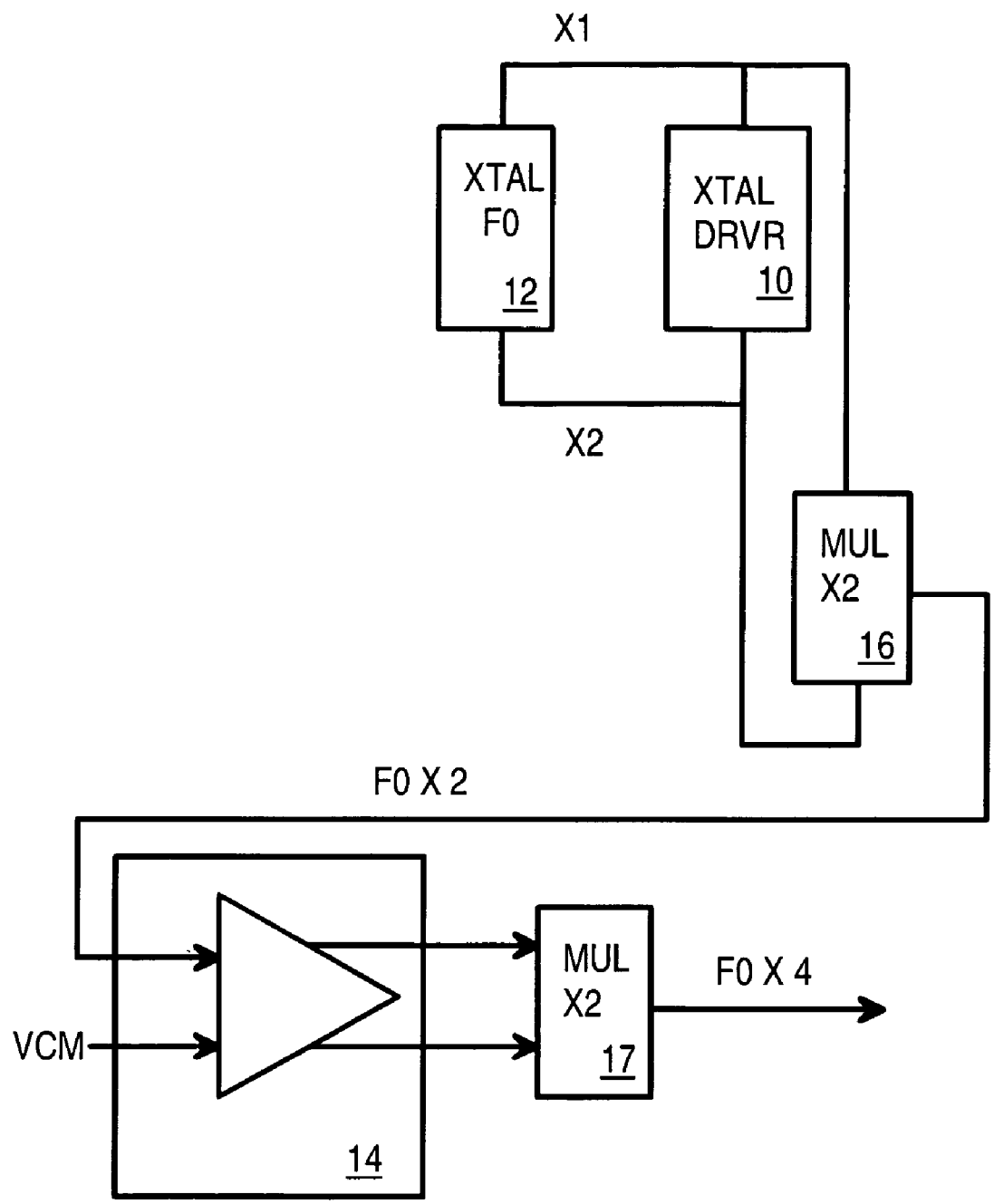
FIG. 1 is a block diagram of a crystal oscillator with differential multiplier circuits.

FIG. 1 is a block diagram of a crystal oscillator with a differential multiplier circuit. Crystal 12 has a third overtone frequency F0 that it exhibits resonance at. The absolute impedance of crystal 12 is at a minimum at frequency F0.

Crystal driver circuit 10 is coupled across the crystal nodes X1, X2 of crystal 12. Crystal driver circuit 10 amplifies the oscillating signal produced by crystal 12.

Multiplier 16 is also coupled to crystal nodes X1, X2 as inputs and doubles the frequency of the amplified signal, outputting a signal that is two times the oscillation frequency of crystal 12, or 2XF0.

Amplifier 14 receives an output from multiplier 16, which is compared to a voltage reference, such as a common-mode voltage Vcm of Vcc/2. Differential outputs from amplifier 14 drive differential inputs of second multiplier 17. Second multiplier 17 doubles the frequency of the differential signal on the differential inputs to generate an output having four times the crystal's frequency, or 4XF0.

Figure 2:
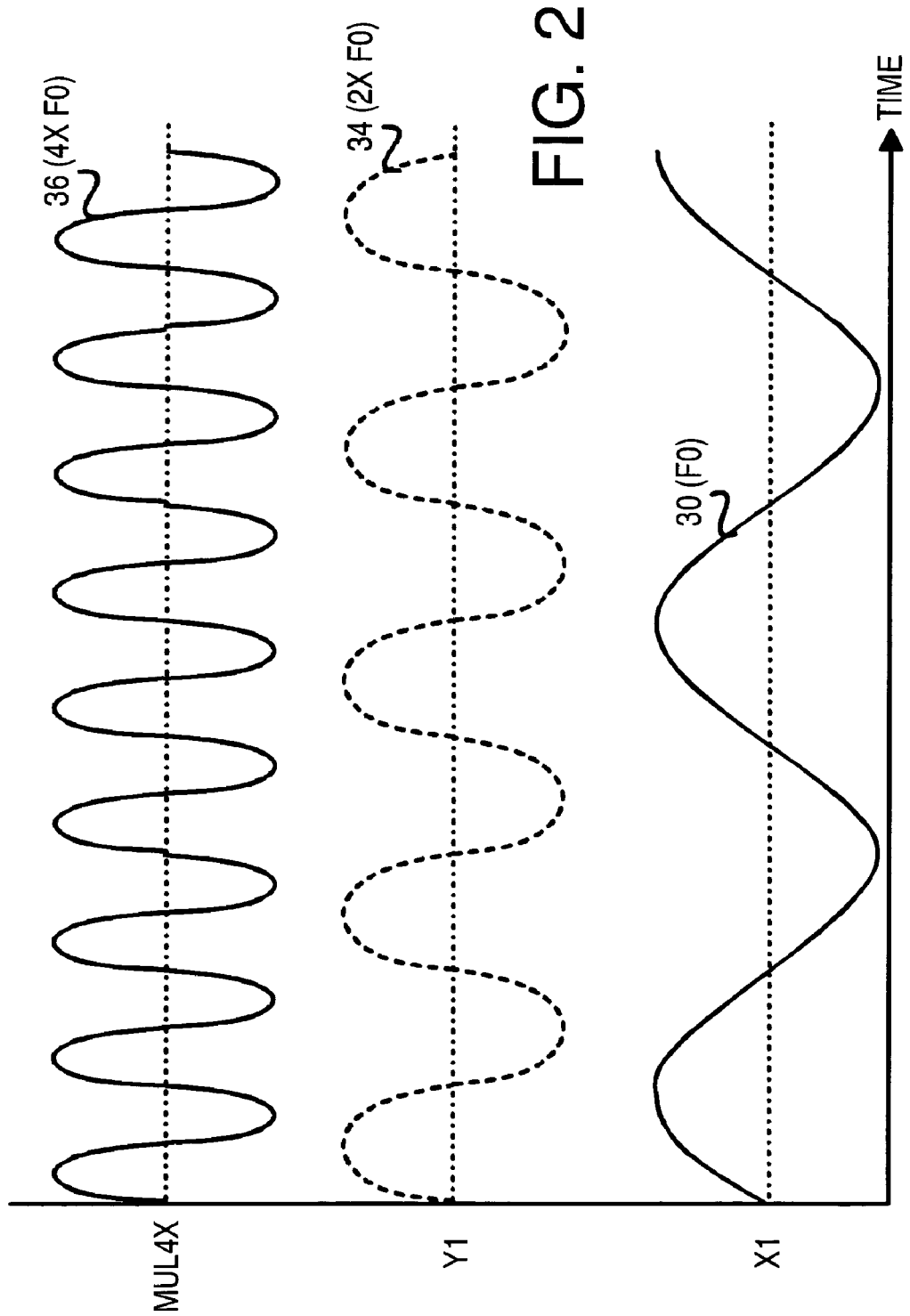
FIG. 2 is a graph showing signal waveforms of the frequency-multiplying crystal oscillator.

FIG. 2 is a graph showing signal waveforms of the frequency-multiplying crystal oscillator. The crystal has an oscillation frequency of F0. This signal 30 is amplified and multiplied by 2 to produce doubled signal 34, with a frequency of 2XF0. Doubled signal 34 is amplified and multiplied by 2 to generate output signal 36, which is four times the oscillation frequency, or 4XF0. The peak-to-peak voltage of the waveforms is about 2V.

For example, crystal 12 can have a 20 MHz operating frequency. The doubled output is at 40 MHz. The final output frequency is 80 MHz. Thus an 80-MHz output is generated from a 20-MHz crystal.

Figure 3:
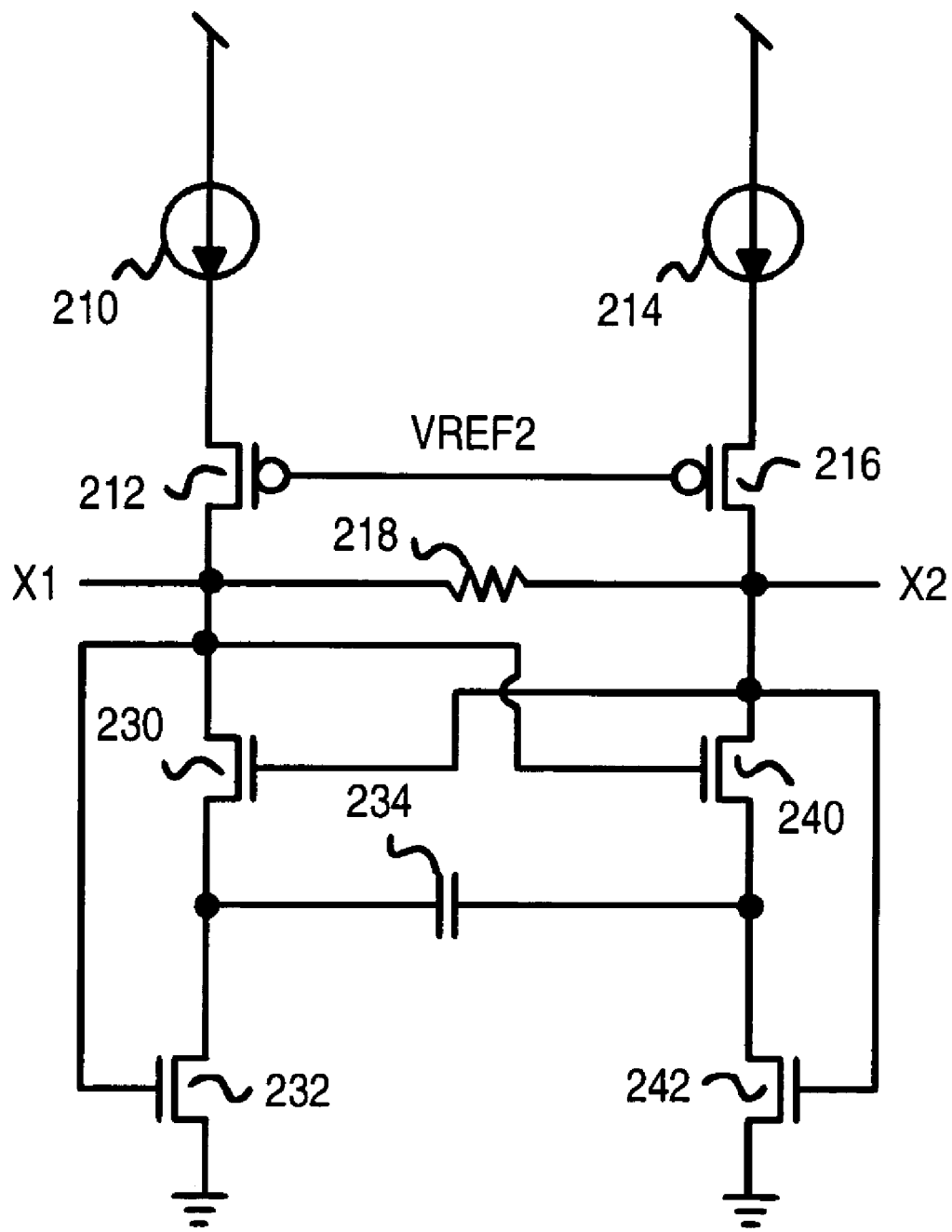
FIG. 3 is a differential crystal driver circuit.

FIG. 3 is a differential crystal driver circuit. This circuit is loosely based on a Pierce oscillator. A reference voltage VREF2 is applied to the gates of second-level p-channel current-source transistors 212, 216, which are in series with current sources 210, 214, respectively. Reference voltage VREF2 can be generated in a conventional manner, such as by a voltage divider.

Shunt resistor 218 is coupled between crystal nodes X1, X2, and has a resistance value designed to force the crystal (not shown) to operate at its third overtone. For example, resistor 218 could be a 15 K-Ohm resistor. The value of shunt resistor 218 can be chosen by simulation. When operation at the natural frequency or another overtone is desired, the value of resistor 218 may be changed, or a more complex filter may be used. Resistor 218 or a filter has a resistance value that is chosen to suppress or attenuate signals from the crystal that are not at the fundamental frequency.

The crystal nodes are cross-coupled to the gates of n-channel upper differential transistors 230, 240, but straight-coupled to the gates of n-channel lower differential transistors 232, 242. For example, current sourced by p-channel transistor 212 to crystal node X1 first passes through the channel of upper differential transistor 230 which has node X2 at its gate, and then through the channel of lower differential transistor 232 which has node X1 at its gate.

On the other side, for crystal node X2, current sourced by p-channel transistor 216 to crystal node X2 first passes through the channel of upper differential transistor 240 which has node X1 at its gate, and then through the channel of lower differential transistor 242 which has node X2 at its gate.

The cross-coupling of the gates of upper differential transistors 230, 240 provides positive feedback to the other crystal node, enhancing oscillation of the crystal. Capacitor 234 is coupled between the two circuit sides, between the drain of lower differential transistor 232 on one side and the drain of lower differential transistor 242 on the other side. Capacitor 234 may be implemented as a Poly2-to-Poly1 silicon dioxide capacitor, with a floating N-well placed beneath the capacitor to reduce its parasitic capacitances.

Figure 4:
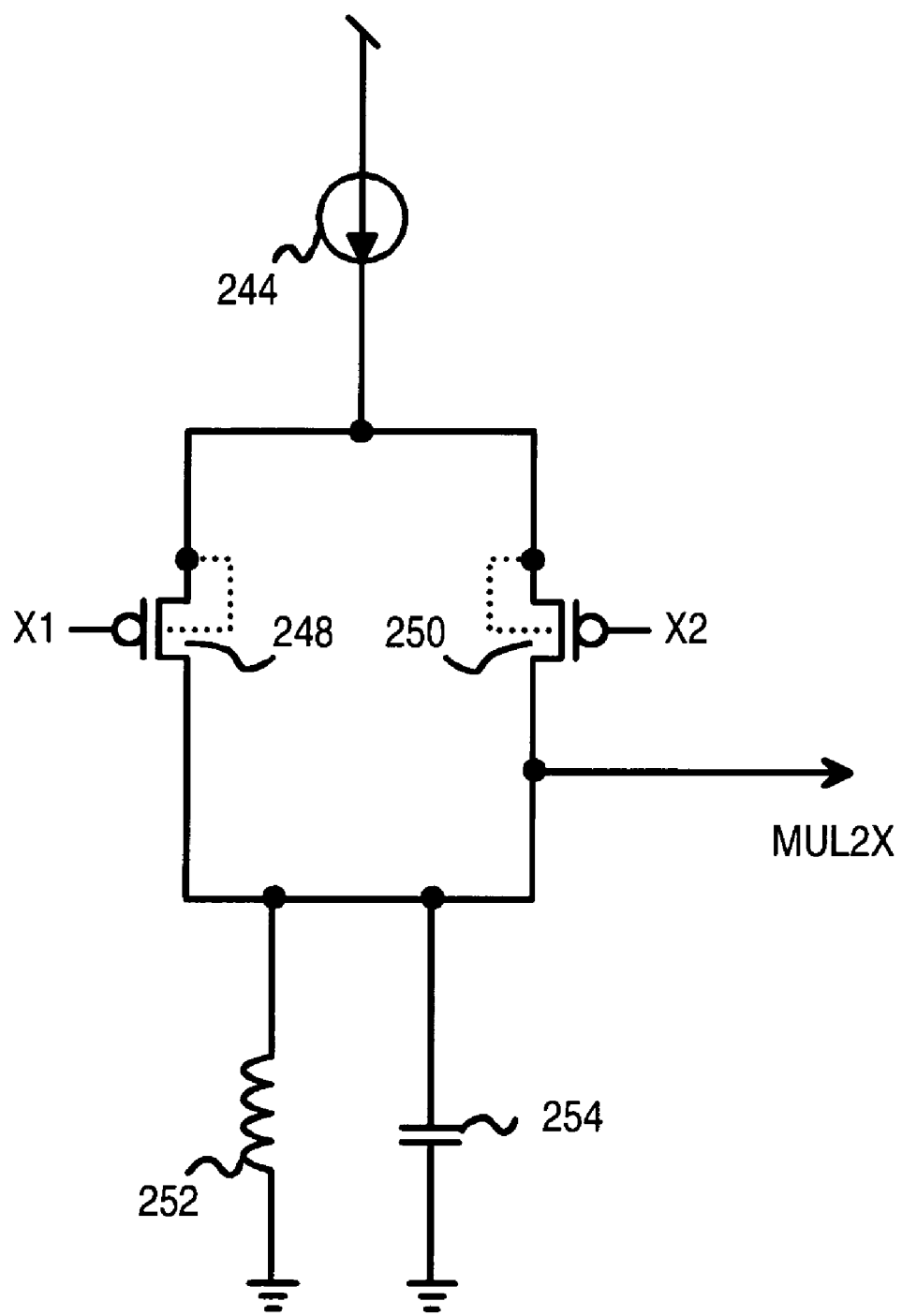
FIG. 4 is a schematic of a first-level differential multiplier.

FIG. 4 is a schematic of a first-level differential multiplier. The first-level multiplier is driven by crystal nodes X1, X2 as inputs.

The frequency-doubled output (MUL2X) is generated by separate current source 244, which drives the sources of p-channel differential transistors 248, 250. Crystal node X1 is applied to the gate of p-channel differential transistor 248, while crystal node X2 is applied to the gate of p-channel differential transistor 250. The drains of p-channel differential transistors 248, 250 are connected together and drive output MUL2X and load capacitor 254 to ground. Inductor 252 can be added to the drains of p-channel differential transistors 248, 250.

Since each of differential transistors 248, 250 typically operate in the saturated region, the drain currents are proportional to the square of the gate voltage, (Vgs)**2. Since the two crystal inputs X1, X2 are 180-degrees out of phase, one input has a sin(wt) component and the other has a sin(-wt) component. When squared and summed, the total drain current has a sin(2 wt) component, with double the sin(wt) input frequency.

Figure 5:
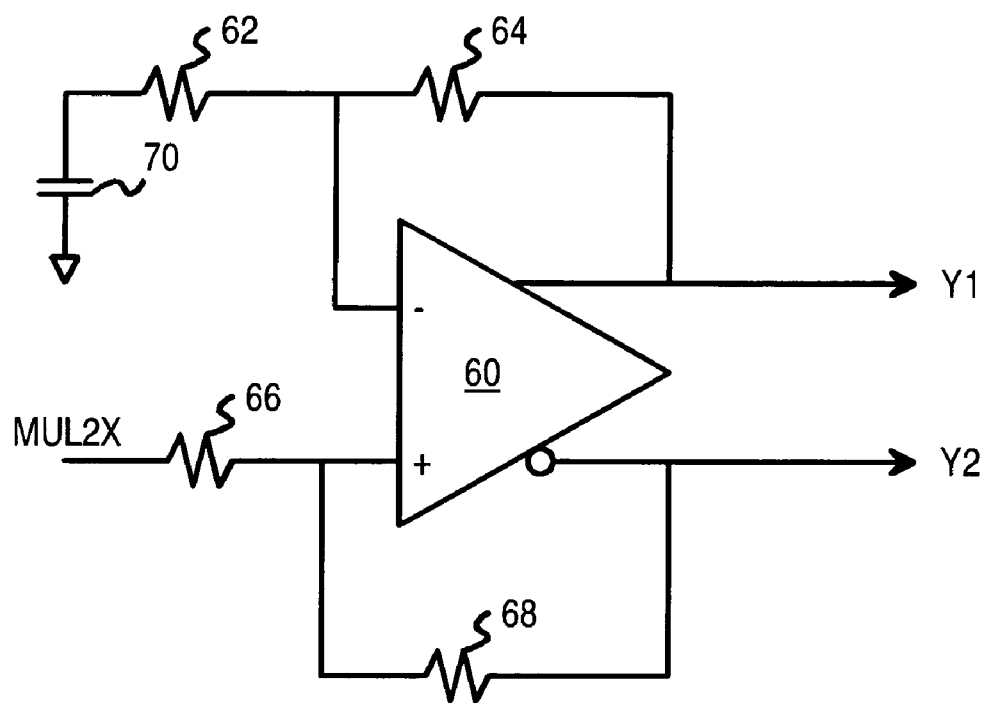
FIG. 5 is a schematic of a differential amplifier between the two multiplier stages.

FIG. 5 is a schematic of a differential amplifier between the two multiplier stages. The differential amplifier includes differential op amp 60, which compares the voltages on its inverting (−) and non-inverting (+) inputs to drive differential outputs Y1, Y2 to the second multiplier stage.

A reference voltage is generated and applied to the inverting input. Resistor 62 is in series with capacitor 70 between ground and the inverting input. Feedback resistor 64 is connected between the inverting input and the non-inverting (Y1) output of op amp 60, and acts as negative feedback to bias the input to a mid-point voltage of Vcc/2.

Likewise feedback resistor 68 is connected between the non-inverting input and the inverting (Y2) output of op amp 60, and acts as negative feedback to bias the other input to a mid-point voltage of Vcc/2. Input resistor 66 is between the doubled output from the first multiplier stage and the non-inverting input of op amp 60.

Figure 6:
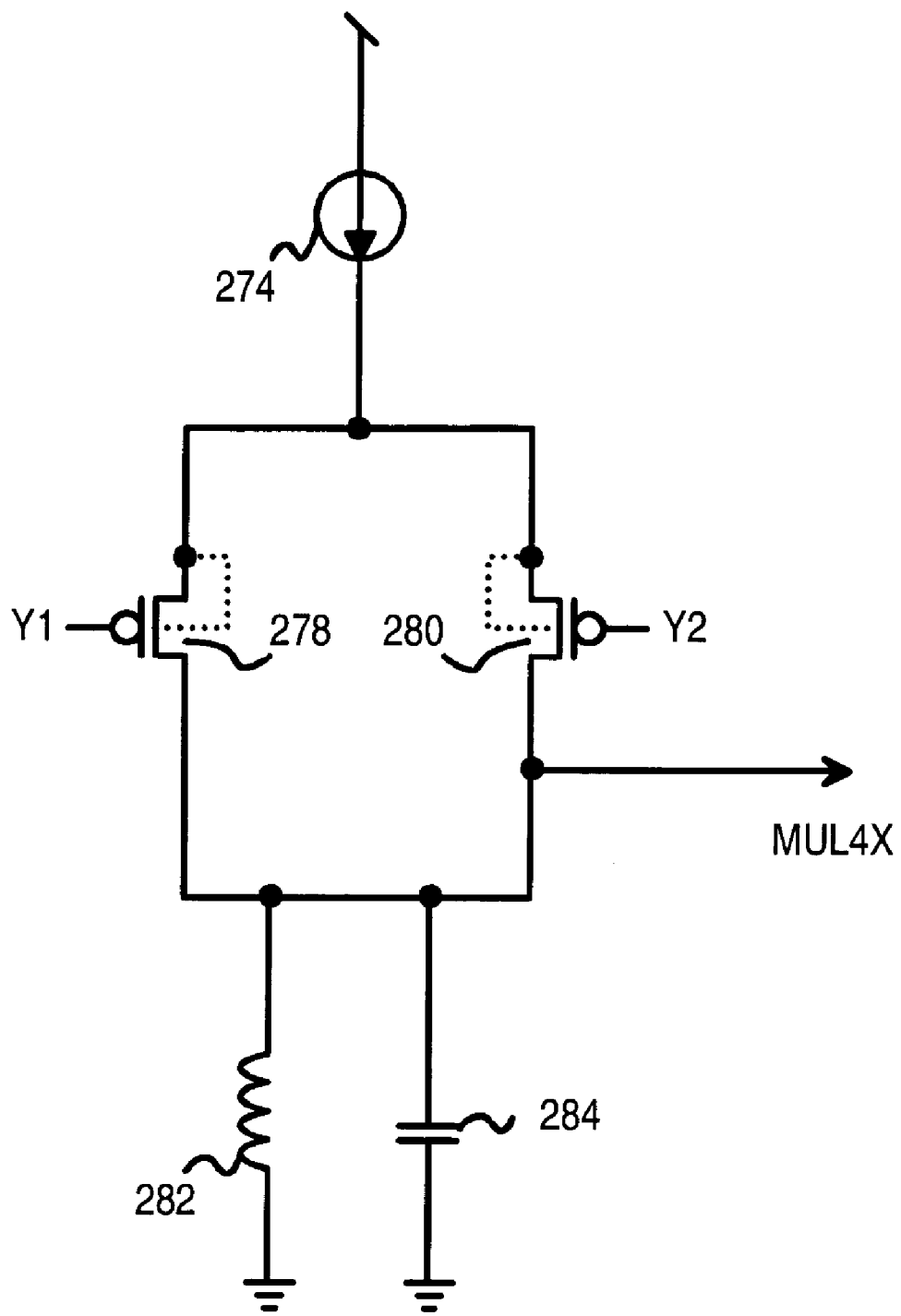
FIG. 6 is a schematic of a second-level differential multiplier.

FIG. 6 is a schematic of a second-level differential multiplier. The differential outputs Y1, Y2 of op amp 60 (FIG. 5) are applied as differential inputs to the second multiplier stage.

The frequency-quadrupled output (MUL4X) is generated by separate current source 274, which drives the sources of p-channel differential transistors 278, 280. Differential doubled signal Y1 is applied to the gate of p-channel differential transistor 278, while differential doubled signal Y2 is applied to the gate of p-channel differential transistor 280. The drains of p-channel differential transistors 278, 280 are connected together and drive output MUL4X and load capacitor 284 to ground. Inductor 282 can be added to the drains of p-channel differential transistors 278, 280.

Since each of differential transistors 278, 280 typically operate in the saturated region, the drain currents are proportional to the square of the gate voltage, (Vgs)**2. Since the inputs Y1, Y2 are 180-degrees out of phase, one input has a sin(wt) component and the other has a sin(−wt) component. When squared and summed, the total drain current has a sin(2 wt) component, with double the sin(wt) input frequency.

The N-wells of p-channel differential transistors 278, 280 (and 248, 250 of FIG. 4) can be connected to their sources rather than to the power supply. This can reduce the body effect and improve linearity.

Theory of Operation

The following is a theory of operation of the crystal driver circuit of FIG. 3. It is submitted with the understanding that it is just a theory that may be incorrect in some respects and for some embodiments.

P-channel transistors 212, and 216 act as cascode current sources to supply constant currents to n-channel cross-coupled transistors 240, 230. Drain-node outputs for each n-channel transistor are tied to the inputs of the opposite-side transistor to provide positive feedback during switching. Transistor 232, 242 are operating in the triode region as current followers forcing the current delivered by transistors 212, 216 across the cross-coupled pair. The two sources of the cross-coupled pair are DC separated and capacitively coupled at high frequencies by capacitors 234, 238.

The circuit structure yields positive feedback only above a given frequency and is thus DC stable. The impedance across nodes X1, X2 is determined by the transconductance (gm) of the cross-coupled pair, transistors 230, 240, resistor 218, capacitors 234, 238, and the loading capacitor across X1 and X2 (which is mainly the inherent capacitance CO of the crystal). The real part of the impedance may be represented by resistor 218, which is positive at low frequency and drops to negative value gain above a frequency set by the above parameters.

The cross-coupled pair of transistors 230, 240 acts as a latch during startup with an unbalanced operating point on nodes X1 and X2. The value of gm, resistor 218, and capacitors 234, 238 are tuned to enhance the oscillation for the third overtone frequency of the crystal.

ALTERNATE EMBODIMENTS

Several other embodiments are contemplated by the inventors. For example n-channel transistors could be swapped for p-channel transistors, and circuits inverted. The inverting input rather than the non-inverting input of the op amp may receive the signal from the first multiplier.

Other kinds of multipliers or additional multiplier stages could be used. Adding a third multiplier stage could result in an 8X output, while having two more multiplier stages could produce a 16X output.

Other kinds of multiplier of amplifier stages could be used. Op amps can be constructed in a variety of ways and use various technologies other that standard CMOS. A common base oscillator amplifier type could be employed.

Outputs could be further buffered, and level-shifted to conform to various logic thresholds, such as low-voltage complementary metal-oxide-semiconductor (LVCMOS), low-voltage pseudo-emitter-coupled logic (LVPECL), low-voltage differential signaling (LVDS), or others. Mask or register programmability can be added.

Stabilizing capacitors, resistors, inductors or other filters can be added to power and ground and other nodes. Multiple power and ground pads may be used. Current sources rather than voltage dividers can be used. Various alternative values of resistors, capacitors, and other components can be used. Additional filters could be added, such as to filter power or ground noise.

Different types of specific oscillator circuit configurations may be used, depending upon the performance required. Transistor substrates can be tied to common buses, such as power or ground, or can be isolated in wells and tied to their sources, depending on the process used. For example, all n-channel transistor substrates could be connected together to ground in a common P-well, while p-channel transistors are formed in separate N-wells that are each biased by the transistor's source, or are connected to the power supply.

A divide-by-2 gate could be added before the final output driver. This may increase the overall end-product flexibility and applicability. Other circuit and product options could be added, as could test circuits.

The two halves of the oscillator circuit that connect to nodes X1, X2 may be as closely matched as possible, since a balanced circuit produces fewer unwanted distortions and requires less filtering. Careful layout of the transistors and components can reduce mis-matches and improve performance. For example, matching transistors can be laid out with the same orientation as well as the same dimensions. Signal trace wiring can be matched as closely as possible in length and geometry. Matching transistors can be laid out near to one another rather than on opposite sides of the die to minimize processing variations within a wafer.

The crystal may vibrate at its natural frequency and output F0 as a fundamental frequency. Alternately, the crystal may be inducted to output its third or other overtone, which is then multiplied to get four times the third overtone, rather than three times the natural frequency.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A crystal oscillator comprising:
   a first crystal node for connecting to a first input to a crystal resonator;
   a second crystal node for connecting to a second input to a crystal resonator;
   a crystal driver coupled between the first and second crystal nodes, for energizing the crystal resonator;
   a first frequency doubler, having a first differential input receiving the first crystal node and a second differential input receiving the second crystal node, the first frequency doubler generating a first doubled signal, the first doubled signal having a frequency substantially double a frequency of the crystal resonator;
   an operational amplifier receiving the first doubled signal as a first input that is compared to a second input to generate a first buffered differential signal and a second buffered differential signal that have a phase difference of 180-degress; and
   a second frequency doubler, having a first differential input receiving the first buffered differential signal and a second differential input receiving the second buffered differential signal, the second frequency doubler generating a final signal, the final signal having a frequency substantially four times the frequency of the crystal resonator,
   whereby the final signal has a frequency that is substantially four times the frequency of the crystal resonator.

2. The crystal oscillator of claim 1 wherein the operational amplifier further comprises:
   an input resistor between the first doubled signal and the first input;
   a first feedback resistor between the first input and the second buffered differential signal; and
   a second feedback resistor between the second input and the first buffered differential signal.

3. The crystal oscillator of claim 2 wherein the first input is a non-inverting input and the second input is an inverting input to the operational amplifier;
wherein the first buffered differential signal is generated by a non-inverting output of the operational amplifier;
wherein the second buffered differential signal is generated by an inverting output of the operational amplifier.

4. The crystal oscillator of claim 3 wherein the operational amplifier further comprises:
a bias resistor between a bias node and the second input.

5. The crystal oscillator of claim 4 wherein the operational amplifier further comprises:
a bias capacitor between the bias node and a fixed voltage supply.

6. The crystal oscillator of claim 2 wherein the first frequency doubler comprises:
a first current source coupled to a first branch node;
a first differential transistor, having a gate receiving the first crystal node, having a first channel between the first branch node and a first summing node;
a second differential transistor, having a gate receiving the second crystal node, having a second channel between the first branch node and the first summing node;
wherein the first doubled signal is generated from the first summing node as a sum of currents through the first and second channels.

7. The crystal oscillator of claim 6 wherein the first summing node oscillates at a frequency substantially double a frequency of oscillation of the first and second crystal nodes.

8. The crystal oscillator of claim 7 further comprising:
a first tail capacitor coupled between the first summing node and a fixed supply, the fixed supply being a power supply or a ground; and
a first tail inductor coupled between the first summing node and the fixed supply.

9. The crystal oscillator of claim 7 wherein the second frequency doubler comprises:
a second current source coupled to a second branch node;
a third differential transistor, having a gate receiving the first buffered differential signal, having a third channel between the second branch node and a second summing node;
a fourth differential transistor, having a gate receiving the second buffered differential signal, having a fourth channel between the second branch node and the second summing node;
wherein the final signal is generated from the second summing node as a sum of currents through the third and fourth channels.

10. The crystal oscillator of claim 9 wherein the second summing node oscillates at a frequency substantially double a frequency of oscillation of the first and second buffered differential signals.

11. The crystal oscillator of claim 10 wherein the crystal driver comprises:
a first current source for supplying current to the first crystal node;
a first cross-over transistor having a gate receiving the second crystal node;
a first direct transistor having a gate receiving the first crystal node;
wherein the first cross-over transistor and the first direct transistor have channels in series between the first crystal node and a supply line, the supply line being a power supply or a ground;
a second current source for supplying current to the second crystal node;
a second cross-over transistor having a gate receiving the first crystal node; and
a second direct transistor having a gate receiving the second crystal node;
wherein the second cross-over transistor and the second direct transistor have channels in series between the second crystal node and the supply line.

12. The crystal oscillator of claim 11 wherein the crystal driver further comprises:
a tuning resistor coupled between the first and second crystal nodes;
a capacitor coupled between a first intermediate node and a second intermediate node;
wherein the first intermediate node is a node between channels of the first cross-over transistor and the first direct transistor, and the second intermediate node is a node between channels of the second cross-over transistor and the second direct transistor.

13. A frequency-multiplying crystal oscillator circuit comprising:
a first current source between a power supply and a first source node;
a first p-channel true differential transistor having a gate receiving a first crystal node, a source connected to the first source node, and a drain connected to a first summing node;
a first p-channel complement differential transistor having a gate receiving a second crystal node, a source connected to the first source node, and a drain connected to the first summing node;
a first tail capacitor coupled between the first summing node and a ground;
an amplifier having a true input, a complement input, a true output, and a complement output;
an input resistor between the first summing node and the true input;
a first feedback resistor between the true input and the complement output;
a second feedback resistor between the complement input and the true output;
a second current source between the power supply and a second source node;
a second p-channel true differential transistor having a gate receiving the true output, a source connected to the second source node, and a drain connected to a second summing node;
a second p-channel complement differential transistor having a gate receiving the complement output, a source connected to the second source node, and a drain connected to the second summing node; and
a second tail capacitor coupled between the second summing node and the ground;
wherein a signal on the second summing node oscillates at a frequency substantially four times a frequency of oscillation of the first crystal node.

14. A clock generator comprising:
oscillating crystal means, having a fundamental frequency of oscillation, for oscillating at the fundamental frequency in response to a first crystal node and a second crystal node;
crystal amplifier means, coupled to the first crystal node and to the second crystal node, for driving the first crystal node and for driving the second crystal node;

tuning resistor means, coupled between the first crystal node and the second crystal node, for tuning the oscillating crystal means to oscillate at the fundamental frequency;

first differential multiplier means, coupled to the first crystal node and to the second crystal node, for generating a doubled output, the doubled output having an output frequency that is double the fundamental frequency of the oscillating crystal means;

op amp means, receiving the doubled output on a first input, for comparing the doubled output to a second input to generate a first buffered differential signal and a second buffered differential signal; and second differential multiplier means, coupled to the first buffered differential signal and to the second buffered differential signal, for generating a quadrupled output, the quadrupled output having an output frequency that is quadruple the fundamental frequency of the oscillating crystal means;

whereby the oscillating crystal means oscillates at the fundamental frequency, while the quadrupled output is four times the fundamental frequency of the oscillating crystal means.

15. The clock generator of claim 14 wherein the crystal amplifier means comprises:

first current source means for driving a current to the first crystal node;

second current source means for driving a current to the second crystal node;

first cross-coupled transistor means, having a gate receiving the second crystal node, for driving a first lower circuit node from the first current source means at the first crystal node;

first direct-coupled transistor means, having a gate receiving the first crystal node, for driving the first lower circuit node from a source coupled to a ground;

second cross-coupled transistor means, having a gate receiving the first crystal node, for driving a second lower circuit node from the second current source means at the second crystal node; and second direct-coupled transistor means, having a gate receiving the second crystal node, for driving the second lower circuit node from a source coupled to the ground.

16. The clock generator of claim 15 wherein the first differential multiplier means comprises:

third current source means for driving a current to a third circuit node; first multiplier transistor means, having a gate receiving the first crystal node, for conducting current between the third circuit node and the doubled output; and second multiplier transistor means, having a gate receiving the second crystal node, for conducting current between the third circuit node and the doubled output.

17. The clock generator of claim 16 wherein the second differential multiplier means comprises:

fourth current source means for driving a current to a fourth circuit node;

third multiplier transistor means, having a gate receiving the first buffered differential signal, for conducting current between the fourth circuit node and the quadrupled output; and fourth multiplier transistor means, having a gate receiving the second buffered differential signal, for conducting current between the fourth circuit node and the quadrupled output.

18. The clock generator of claim 16 further comprising:

a first feedback resistor, coupled between the first input of the op amp means and the second buffered differential signal;

a second feedback resistor, coupled between the second input of the op amp means and the first buffered differential signal;

an input resistor, coupled between the doubled output and the first input to the op amp means;

a bias resistor, coupled between the second input and a fifth node; and a capacitor, coupled between the fifth node and the ground.

19. The clock generator of claim 18 wherein the first input to the op amp means is a non-inverting input;

wherein the second input to the op amp means is an inverting input;

wherein the first buffered differential signal from the op amp means is generated at a non-inverting output;

wherein the second buffered differential signal from the op amp means is generated at an inverting output.

20. The clock generator of claim 18 wherein the fundamental frequency of oscillation of the oscillating crystal means is a natural frequency of the oscillating crystal means or is a third overtone of the natural frequency of the oscillating crystal means.

* * * * *